United States Patent
Hsu et al.

(10) Patent No.: US 7,994,001 B1
(45) Date of Patent: Aug. 9, 2011

(54) TRENCHED POWER SEMICONDUCTOR STRUCTURE WITH SCHOTTKY DIODE AND FABRICATION METHOD THEREOF

(75) Inventors: Hsiu Wen Hsu, Hsinchu County (TW); Chun Ying Yeh, Hsinchu (TW)

(73) Assignee: Great Power Semiconductor Corp., Taipei County (TW)

( * ) Notice: Subject to any disclaimer, the term of this patent is extended or adjusted under 35 U.S.C. 154(b) by 0 days.

(21) Appl. No.: 12/777,481

(22) Filed: May 11, 2010

(51) Int. Cl.
*H01L 21/8234* (2006.01)
*H01L 21/44* (2006.01)
*H01L 29/66* (2006.01)

(52) U.S. Cl. .......................... 438/237; 438/570; 257/476

(58) Field of Classification Search .......................... None
See application file for complete search history.

(56) References Cited

U.S. PATENT DOCUMENTS

| | | | |
|---|---|---|---|
| 6,251,730 B1* | 6/2001 | Luo | 438/270 |
| 6,621,107 B2* | 9/2003 | Blanchard et al. | 257/155 |
| 7,564,097 B2* | 7/2009 | Ono et al. | 257/330 |
| 2009/0065855 A1* | 3/2009 | Bhalla et al. | 257/328 |
| 2009/0224316 A1* | 9/2009 | Bhalla et al. | 257/332 |
| 2009/0305475 A1* | 12/2009 | Hshieh | 438/237 |
| 2009/0315106 A1* | 12/2009 | Hsieh | 257/334 |

* cited by examiner

*Primary Examiner* — Scott B Geyer
(74) *Attorney, Agent, or Firm* — Rosenberg, Klein & Lee

(57) ABSTRACT

A fabrication method of a trenched power semiconductor structure with a schottky diode is provided. Firstly, a drain region is formed in a substrate. Next, at least two gate structures are formed above the drain region, and then, a body and at least a source region are formed between the two adjacent gate structures. Thereafter, a first dielectric structure is formed on the gate structure to shield the gate structure. Then, a contact window is formed in the body and has side surface thereof adjacent to the source region to expose the source region. Afterward, a second dielectric structure is formed in the contact window. Next, by using the second dielectric structure as an etching mask, the body is etched to form a narrow trench extending to the drain region below the body. Finally, a metal layer is filled into the contact window and the narrow trench.

18 Claims, 9 Drawing Sheets

TRENCHED POWER SEMICONDUCTOR STRUCTURE WITH SCHOTTKY DIODE AND FABRICATION METHOD THEREOF

BACKGROUND OF THE INVENTION

1. Field of the Invention

This invention relates to a trenched power semiconductor structure and a fabrication method thereof, and more particularly relates to the trenched power semiconductor structure with Schottky Diode.

2. Description of Related Art

In present, the trend in development for trenched power semiconductor devices is towards the performance of switching speed, which is especially helpful for reducing switching loss in high-frequency applications. Among various solutions for improving switching speed, it is an effective method to add a schottky diode in the power semiconductor structure.

FIG. 1 is a circuit diagram showing a metal-oxide-semiconductor (MOS) transistor T1 with a schottky diode SD1 to improve switching loss. As shown, the MOS transistor T1 has a body diode D1 connected to the schottky diode SD1 in parallel. Because the turn-on voltage of the schottky diode SD1 is smaller than that of the body diode D1, the current would be directed from the source electrode S through the schottky diode SD1 to the drain electrode D when the MOS transistor T1 becomes forwardly biased, and the body diode D1 would not be conducted.

Because of the minority carriers, the switching of the body diode D1 is quite slow, which may cause unwanted time delay and result in switching loss. The usage of schottky diode, which has no minority carriers, is able to improve the problems of time delay and switching loss due to the conduction of body diode D1.

SUMMARY OF THE INVENTION

Accordingly, it is a main object of the present invention to provide a method to manufacture a trenched power transistor with a parallel-connected schottky diode simultaneously by using the widely-used semiconductor fabrication technologies.

To achieve the above mentioned object, a fabrication method of a trenched power semiconductor structure with a schottky diode is provided. Firstly, a drain region is formed in a substrate. Next, at least two gate structures are formed above the drain region, and then, a body and at least a source region are formed between the two adjacent gate structures. Thereafter, a first dielectric structure is formed on the gate structure to shield the gate structure. Then, by using the first dielectric structure as an etching mask, a contact window is formed in the body and has side surface thereof adjacent to the source region to expose the source region. Afterward, a second dielectric structure is formed in the contact window. The second dielectric structure defines at least an open to expose a portion of the bottom of the contact window. Next, by using the second dielectric structure as an etching mask, the body is etched to form a narrow trench extending to the drain region below the body. Finally, a metal layer is filled into the contact window and the narrow trench.

According to the fabrication method mentioned above, a trenched power semiconductor structure with a schottky diode is provided in the present invention. The trenched power semiconductor structure has a drain region, at least two gate structures, a body, at least a source region, a dielectric structure, a contact window, a narrow trench, and a metal layer. The gate structures are located above the drain region. The body is located above the drain region and between the two neighboring gate structures. The source region is located in the body and adjacent to the gate structure. The dielectric structure covers the gate structure. The contact window is located in the upper portion of the body and the dielectric structure, and is adjacent to the source region. The narrow trench is extended from a bottom of the contact window downward to the drain region. A width of the narrow trench is smaller than that of the contact window. The metal layer is located in the contact window and the narrow trench to electrically connect the source region and a schottky diode is formed at the interface between the metal layer and the drain region.

BRIEF DESCRIPTION OF THE DRAWINGS

The present invention will now be specified with reference to its preferred embodiment illustrated in the drawings, in which.

DETAILED DESCRIPTION OF THE PREFERRED EMBODIMENTS

It is a main feature of the present invention to adopt the conventional spacer technology to form spacer in the contact window to define a narrow trench deeply extended to the body. Thereby, the metal layer filled into the contact window and the narrow trench is able to electrically connect the source electrode, the body, and the drain electrode simultaneously so as to form a schottky barrier diode (SBD) at the interface between the metal layer and the drain electrode. The schottky diode is connected with the zener diode at the interface between the body and the drain electrode in parallel. Thus, the time delay due to the conduction of body diode in the transistor unit can be prevented and switching loss can be reduced.

Figure 1:
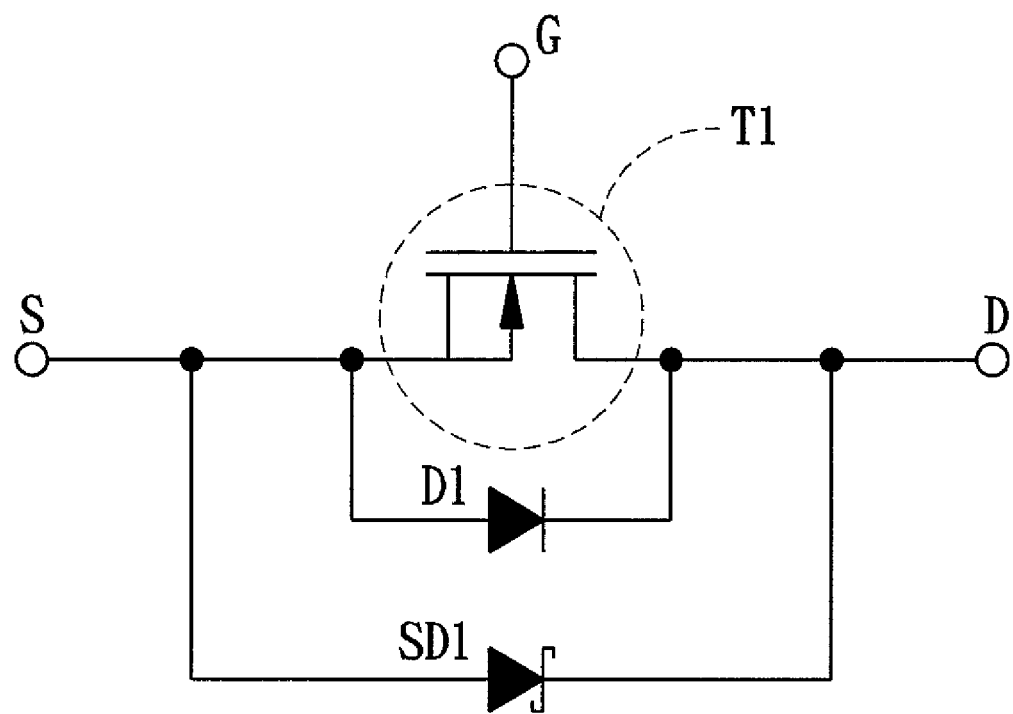
FIG. 1 is a circuit diagram showing a metal-oxide-semiconductor structure with a schottky diode to improve switching loss.
Figure 2A:
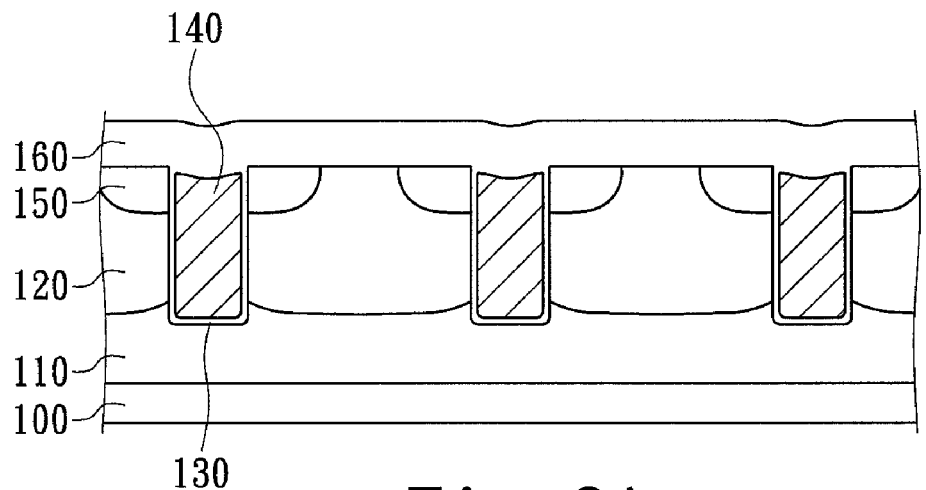
FIGS. 2A to 2E are schematic views showing a fabrication method of a trenched power semiconductor structure with a schottky diode in accordance with a first embodiment of the present invention.
Figure 2B:
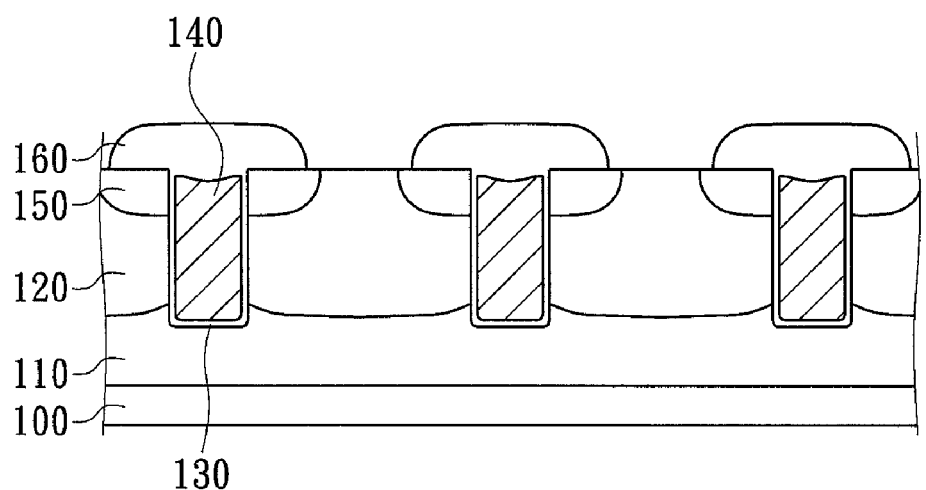
Figure 2C:
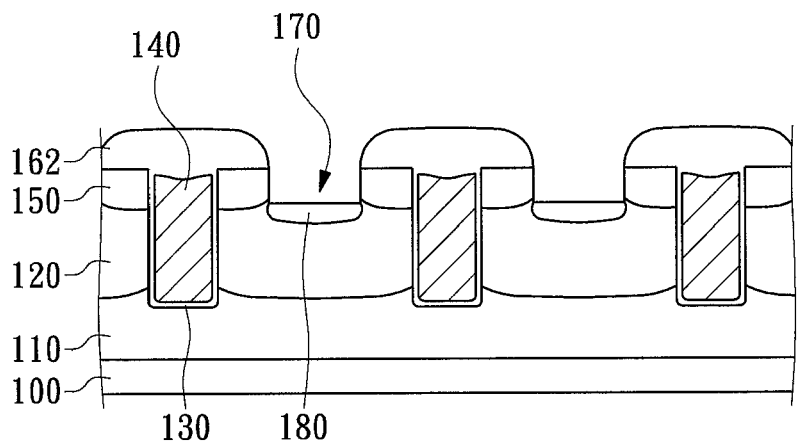
Figure 2D:
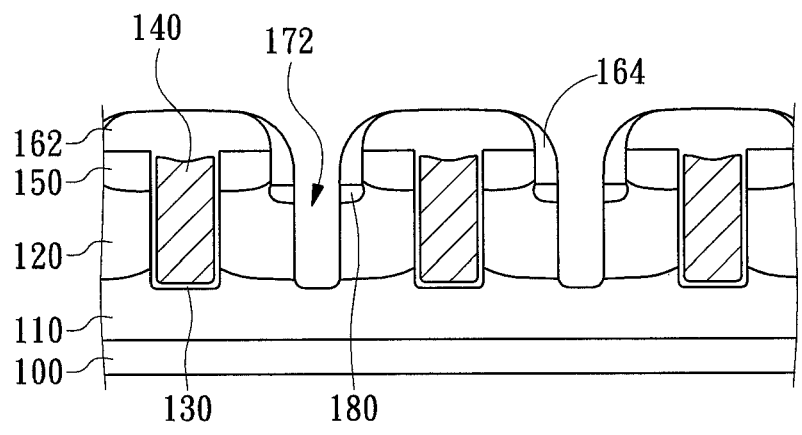
Figure 2E:
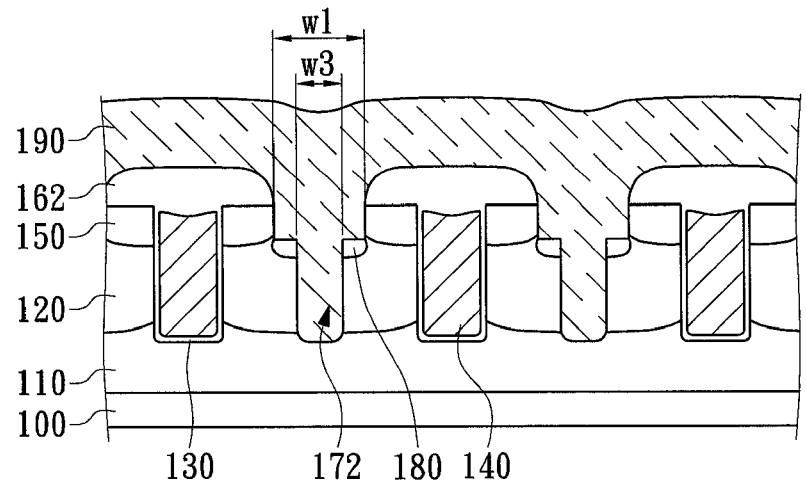

FIG. 2E is a cross-section view of a trenched power semiconductor structure with a schottky diode in accordance with an embodiment of the present invention. As shown, the trenched power semiconductor structure has a N-type substrate 100, a N-type epitaxial layer 110, at least two gate structure 140, a P-body 120, at least a N-type source region 150, a first dielectric structure 162, a contact window 170, a narrow trench 172, and a metal layer 190. The N-type substrate 100 and the N-type epitaxial layer 110 formed thereon compose a drain region of the trenched power semiconductor structure.

The gate structure 140, such as a polysilicon gate structure, is formed on the N-type epitaxial layer 110. The P-body 120 is also formed on the N-type epitaxial layer 110 and is located between two neighboring gate structures 140. A gate dielectric layer 130 encircles the gate structure 140 to electrically isolate the gate structure 140 from the P-body 120 and the N-type epitaxial layer 110. The N-type source region 150 is located in the P-type 120 and adjacent to the gate structure 140. The first dielectric structure 162 covers the gate structure 140. The contact window 170 is located in the upper portion of the P-body 120 and extended upward into the first dielectric structure 162. In addition, the contact window 170 is adjacent to the N-type source region 150 to expose the N-type source region 150.

A P-type heavily doped region 180 is formed in the P-body 120 right below the contact window 170 for reducing contact resistance between the metal layer 190 and the P-body 120. The narrow trench 172 is extended from a bottom of the contact window 170 through the heavily doped region 180 to the N-type epitaxial layer 110. In addition, a width w3 of the narrow trench 172 is smaller than a width w1 of the contact window 170. The metal layer 190 is located in the contact window 170 and the narrow trench 172 and electrically connected to the N-type source region 150. There is a schottky diode formed at the interface between the metal layer 190 and the N-type epitaxial layer 110.

FIGS. 2A to 2E are schematic views showing a fabrication method of a trenched power semiconductor structure with a schottky diode in accordance with a first embodiment of the present invention. Firstly, as shown in FIG. 2A, a N-type epitaxial layer 110 is formed on a N-type substrate 100 such that a drain region of the power semiconductor structure is composed. Then, at least two gate structures 140 are formed in the epitaxial layer 110 above the drain region. Afterward, a body 120 and at least a source region 150 are formed between the two neighboring gate structures 140.

The gate structure 140, the body 120, and the source region 150 can be fabricated by using conventional power semiconductor fabrication processes. For example, as to the formation of the gate structures 140, the epitaxial layer 110 is etched first to form at least two gate trenches formed in the upper portion of the epitaxial layer 110 and then the gate dielectric layer 130 and the gate structure 140 are formed in the gate trenches in series. Afterward, the P-body 120 is formed in the upper portion of the epitaxial layer 110 by ion implantation, and the source region 150 is then defined in the P-body 120 and formed adjacent to the gate structure 140 by ion implantation.

Next, as shown in FIGS. 2A and 2B, a first dielectric layer 160 is deposited on the epitaxial layer 110. Then, at least an open is defined in the first dielectric structure 160 corresponding to the P-body 120 between the two neighboring gate structures 140. Afterward, the open is formed in the first dielectric layer 160 by etching and a flattening step is carried out to form the first dielectric structure 162 covering the gate structure 140 and having at least an open corresponding to the P-body 120. The flattening step is an optional step.

Next, as shown in FIG. 2C, the P-body 120 is etched to form a contact window 170 in the upper portion thereof by using the first dielectric structure 162 as an etching mask. The contact window 170 is aligned to the open in the first dielectric structure 162 and is utilized to expose the P-body 120 and the source region 150. Thereafter, an ion implantation process is carried out to form a P-type heavily doped region 180 in the P-body 120 below the contact window 170.

Then, as shown in FIG. 2D, a second dielectric structure 164 with at least an open to expose a portion of the bottom of the contact window 170 is formed in the contact window 170.

The second dielectric structure 164 may be a dielectric spacer lining the side surface of the contact window, for example. As to the detail fabrication process of the second dielectric structure 164, a second dielectric layer may be deposited along the exposed surfaces of the first dielectric structure 162 and the contact window 170 first, and an anisotropic etching step is followed to remove the portion of the second dielectric layer on the upper surface of the first dielectric structure 162 and on the bottom of the contact window 170 to leave the second dielectric structure 164. The above mentioned anisotropic etching step does not need to use mask to define the location of the spacer.

As shown, the second dielectric structure 164 includes a sidewall structure extended from a bottom of the contact window 170 to the first dielectric structure 162. The side surface of the contact window 170 is totally covered by the second dielectric structure 164 in the present embodiment. In addition, the second dielectric structure 164 defines at least an open at the bottom of the contact window 170. Thereafter, by using the second dielectric structure 164 as an etching mask, the narrow trench 172 is formed at the bottom of the contact window 170. The narrow trench 172 penetrates the P-type heavily doped region 180 and the P-body 120, and is extended to the N-type epitaxial layer 110 below the P-body 120.

Finally, as shown in FIG. 2E, the second dielectric structure 164 is removed by selectively etching to expose the contact window 170 and keep the first dielectric structure 162 on the gate structure 140. The first dielectric structure 162 may be composed of silicon oxide, and the second dielectric structure 164 may be composed of silicon nitride, for example. However, the present invention is not so limited. Any dielectric material suitable for the above mentioned selectively etching process can be applied in the present embodiment. Thereafter, a metal layer 190 is filled into the contact window 170 and the narrow trench 172 to electrically connect the source region 150, the P-body 120, and the N-type epitaxial layer 110, and the fabrication process of the trenched power semiconductor structure with a schottky diode is finished.

Figure 3A:
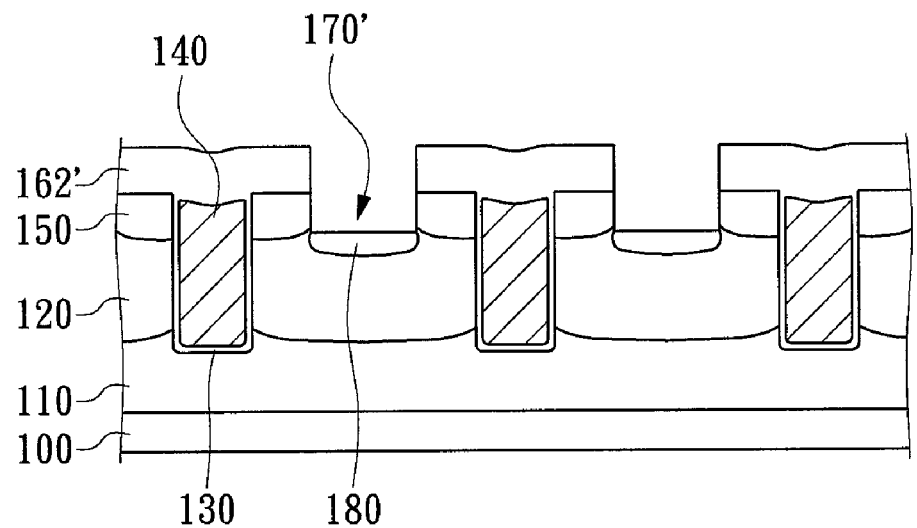
FIGS. 3A and 3B are schematic views showing a fabrication method of a trenched power semiconductor structure with a schottky diode in accordance with a second embodiment of the present invention.
Figure 3B:
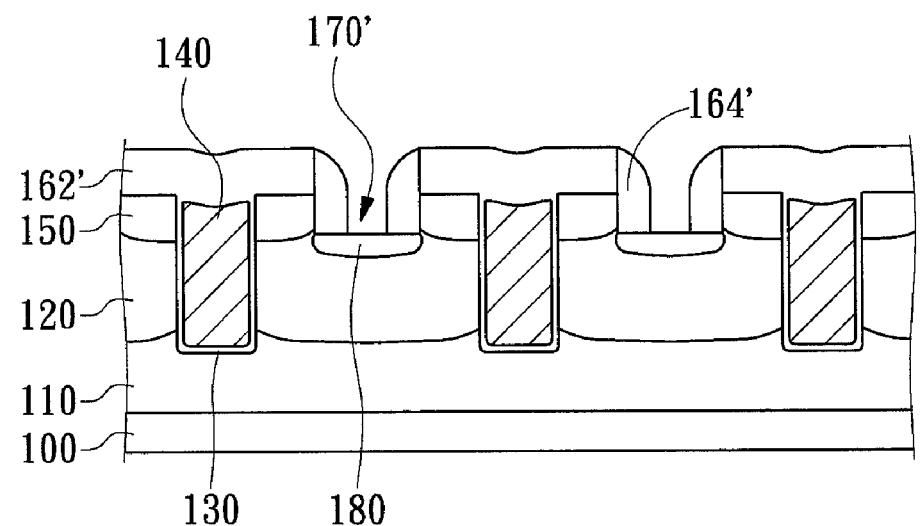

FIGS. 3A and 3B are schematic views showing a fabrication method of a trenched power semiconductor structure with a schottky diode in accordance with a second embodiment of the present invention. In contrast with the first embodiment as shown in FIGS. 2B and 2C, which has a first dielectric structure 162 formed on the P-body 120 as an etching mask for forming the contact window 170, the contact window 170' of the present embodiment is formed by etching the first dielectric layer 160 and the P-body 120 in the same etching step, and the flattening step as shown in FIG. 2B is also skipped in the present embodiment. The other fabrication steps in the present embodiment are identical or similar to that of the first embodiment, and thus are not repeated here.

Figure 4A:
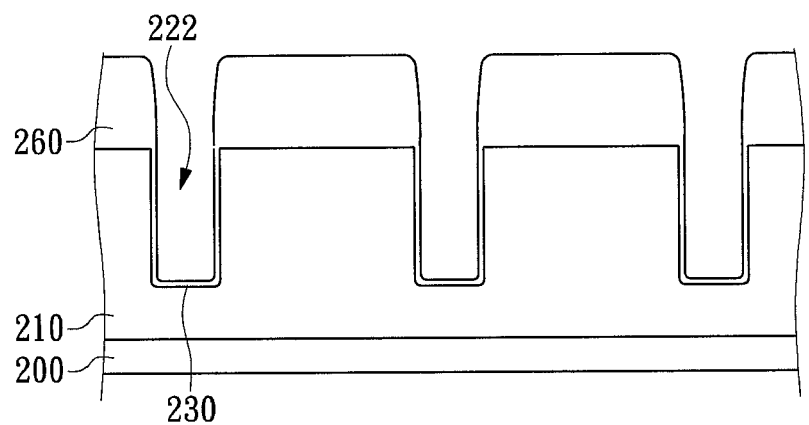
FIGS. 4A to 4I are schematic views showing a fabrication method of a trenched power semiconductor structure with a schottky diode in accordance with a third embodiment of the present invention.
Figure 4B:
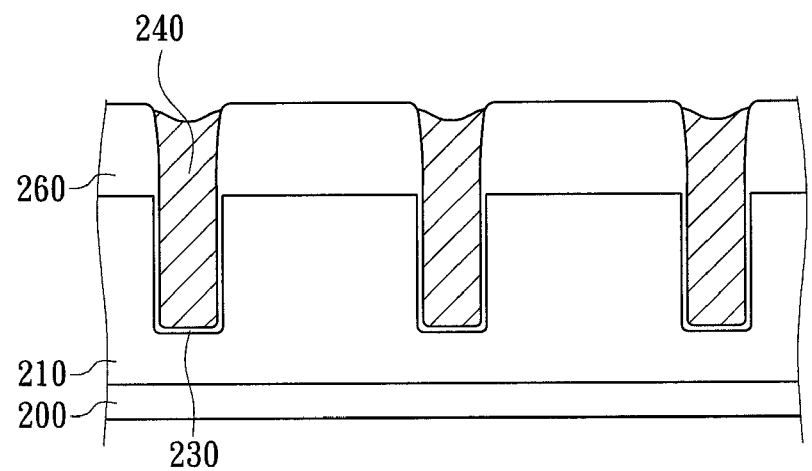
Figure 4C:
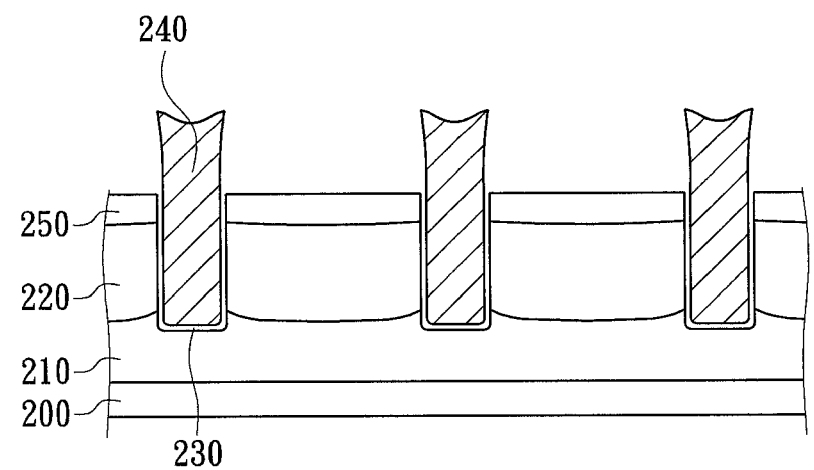
Figure 4D:
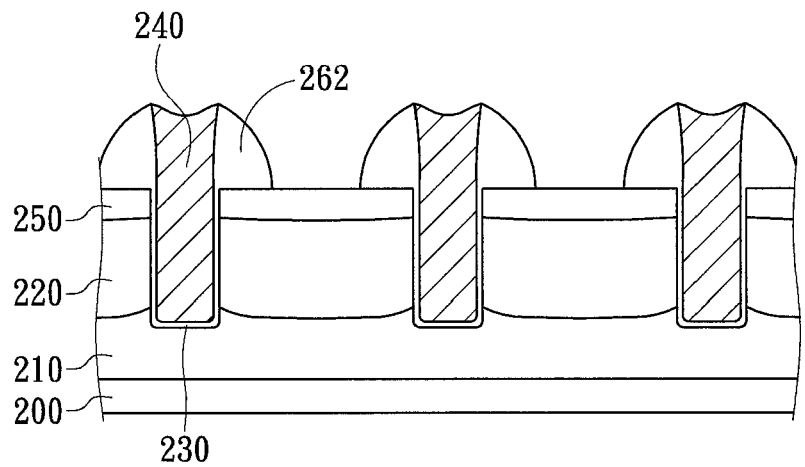
Figure 4E:
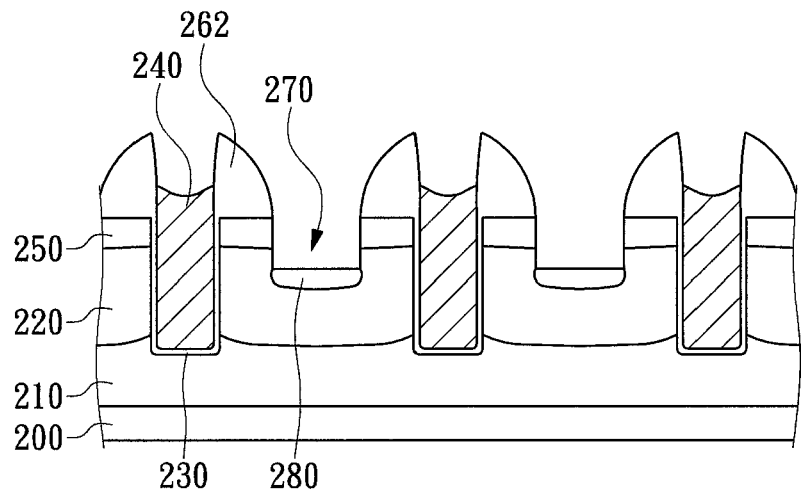
Figure 4F:
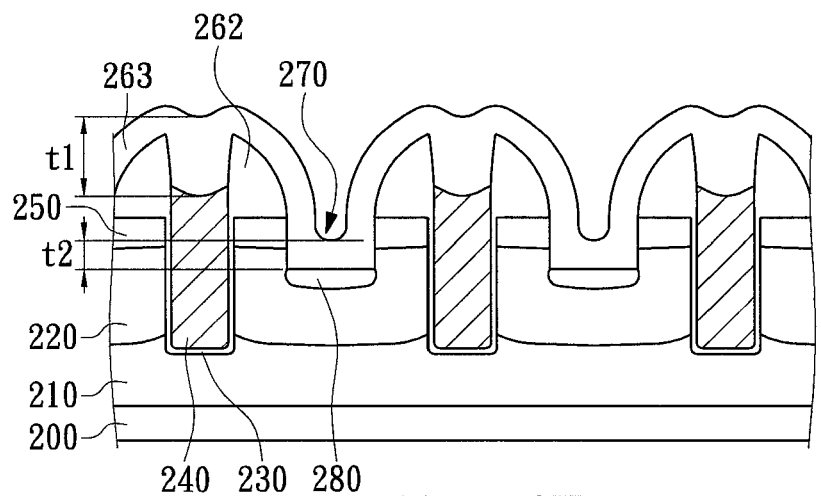
Figure 4G:
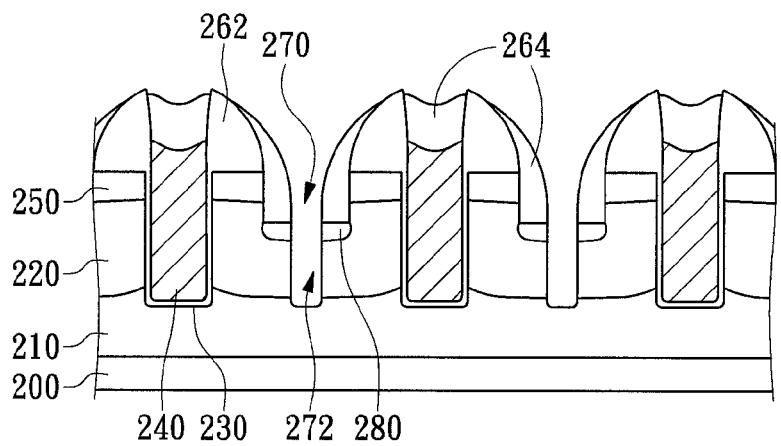
Figure 4H:
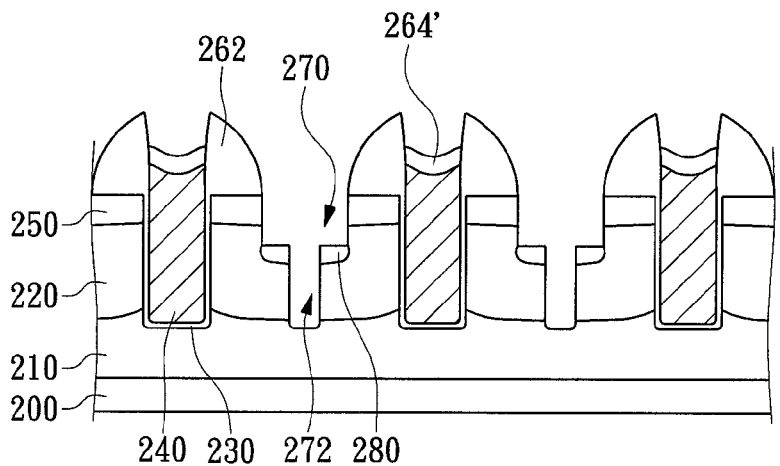
Figure 4I:
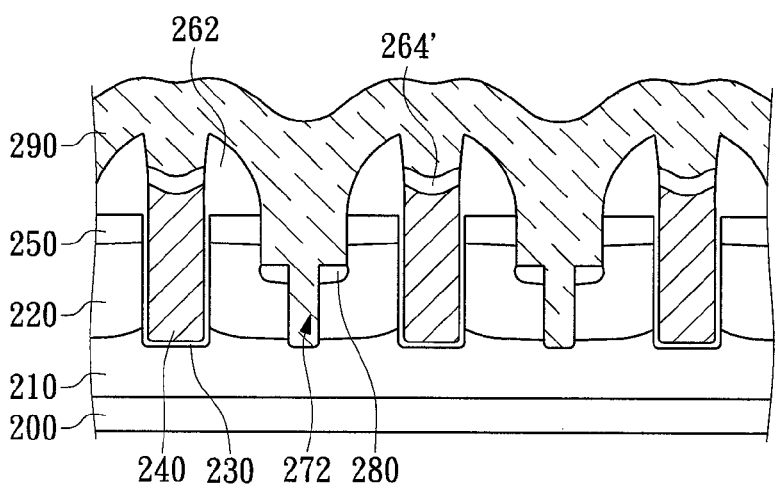

FIG. 4I is a cross-section view showing a trenched power semiconductor structure with a schottky diode in accordance with another embodiment of the present invention. In contrast with the first embodiment as shown in FIG. 2E, the gate structure 240 of the present embodiment is protruded from the upper surface of the P-body 120 and the trenched power semiconductor structure has a first dielectric structure 262 and a second dielectric structure 264' covering the side surface and the upper surface of the gate structure 240 for electrically isolating the gate structure 240 from the metal layer 290. The first dielectric structure 262 and the second dielectric structure 264' may be composed of silicon oxide and silicon nitride respectively. However, the present invention is not so limited. The first dielectric structure 262 and the second dielectric structure 264' may be composed of any dielectric material suitable for proceeding selectively etching.

FIGS. 4A to 4I are schematic views showing a fabrication method of a trenched power semiconductor structure with a schottky diode in accordance with a third embodiment of the present invention. Firstly, as shown in FIG. 4A, an epitaxial layer 210 is formed on a substrate 200. Then, a pattern layer 260 is formed on the upper surface of the epitaxial layer 210 to define a plurality of trenches in the epitaxial layer 210. Thereafter, through the pattern layer 260, the trenches 222 are formed in the epitaxial layer 210 by etching. Then, a dielectric layer 230 is formed to line the inner surface of the trench 222. Thereafter, as shown in FIG. 4B, the trenches 222 and the open of the pattern layer 260 are filled with polysilicon material to form a plurality of gate structures 240. These gate structures 240 are located in the trenches 222 and protruded from the upper surface of the epitaxial layer 210.

Next, as shown in FIG. 4C, the pattern layer 260 is removed. Then, an ion implantation process is carried out to implant P-type dopants into the epitaxial layer 210 to form the P-body 220. Thereafter, another ion implantation process is carried out to implant N-type dopants into the surface region of the P-body 220 to form the N-type doped region 250 as the source region of the transistor structure.

Thereafter, as shown in FIG. 4D, a first dielectric structure 262 is formed on the epitaxial layer 210 to cover at least the sidewall of the protruding portion of the gate structure 240. The first dielectric structure 262 may be a dielectric spacer lining the exposed sidewall of the gate structure 240, for example. As to the detailed fabrication process of the first dielectric structure 262, a first dielectric layer is deposited on the epitaxial layer 210 and the gate structure 240 first, and then an anisotropic etching step is followed to remove the portion of the first dielectric layer on the epitaxial layer 210 so as to form the first dielectric structure 262 lines the sidewall of the gate structure 240. It is noted that the upper surface of the gate structure 240 is exposed after the above mentioned etching step.

Next, as shown in FIG. 4E, by using the first dielectric structure 262 as an etching mask, the P-body 220 is etched to form a contact window 270 in the upper portion thereof. The N-type doped region 250 is separated by the contact window 270 into two portions corresponding to the two neighboring gate structures 240. Thereafter, an ion implantation process is carried out to form a heavily doped region 280 in the P-body 220 right below the contact window 270. It is noted that the upper surface of the gate structure 240 would be etched in the etching step as shown in FIG. 4E for the upper surface of the gate structure 240 is not shielded by the first dielectric structure 262. Thus, a concave encircled by the first dielectric structure 262 would be formed right above the gate structure 240.

Next, as shown in FIG. 4F, a second dielectric layer 263 is deposited on the exposed surface of the first dielectric structure 262 and the contact window 270. The second dielectric layer 263 also fills the concave above the gate structure 240. Then, as shown in FIG. 4G, a portion of the second dielectric layer 263 at the bottom of the contact window 270 is removed by etching to leave the second dielectric structure 264 at least lining the sidewall of the contact window 270. It is noted that because the width of the gate structure 240 is much smaller than that of the contact window 270, the thickness t1 of the second dielectric layer 263 on the gate structure 240 depending on the depth of the concave above the gate structure 240 would be much greater than the thickness t2 of the second dielectric layer 263 at the bottom of the contact window 270. Thus, after the portion of the second dielectric layer 263 at the bottom of the contact window 270 being removed, the sidewall of the contact window 270 and the upper surface of the gate structure 240 are still covered by the remained second dielectric structure 264.

As shown in FIG. 4G, after the formation of the second dielectric structure 264, an etching step is carried out by using the second dielectric structure 264 as an etching mask to form a narrow trench 272 penetrating the P-type heavily doped region 280 and the P-body 220 and extending to the N-type epitaxial layer 210 below the P-body 220.

Thereafter, as shown in FIG. 4H, the portion of the second dielectric structure 264 on the sidewall of the contact window 270 is removed to expose the source region 250. In the present embodiment, the thickness of the second dielectric layer 263 in the concave above the gate structure 240 is large enough such that after the etching step of FIGS. 4G and 4H, a portion of the second dielectric layer 263, the second dielectric structure 264', is still remained on the upper surface of the gate structure 240. Finally, as shown in FIG. 4I, a metal layer 290 is filled in to the contact window 270 and the narrow trench 272, and the fabrication process of a trenched power semiconductor structure with a schottky diode of the present embodiment is finished.

Figure 5A:
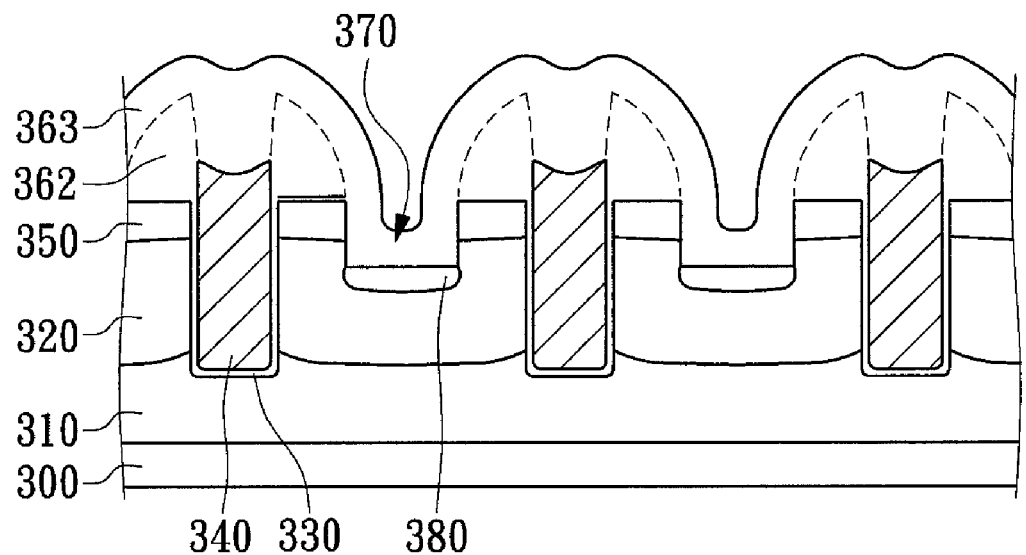
FIGS. 5A to 5D are schematic views showing a fabrication method of a trenched power semiconductor structure with a schottky diode in accordance with a fourth embodiment of the present invention.
Figure 5B:
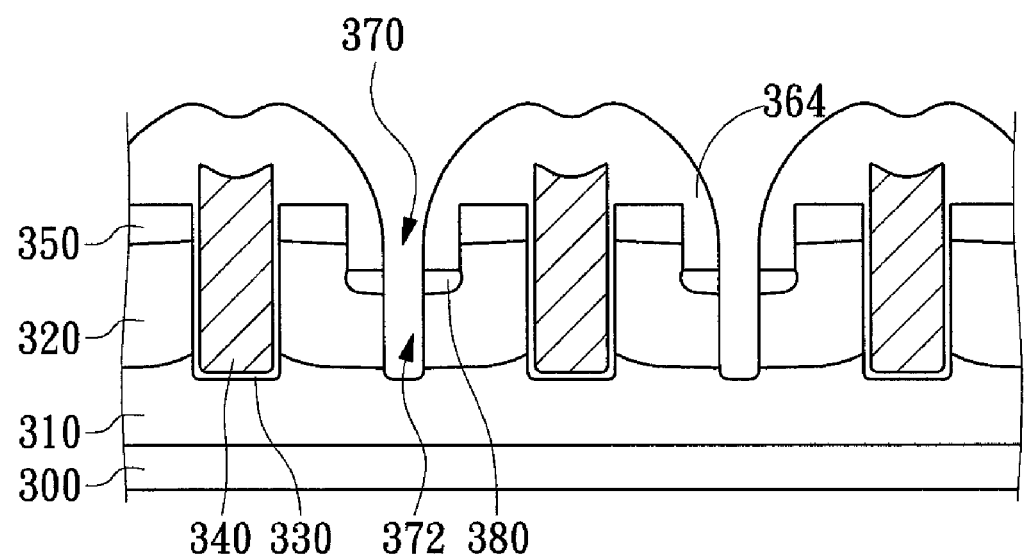

In the present embodiment, the first dielectric structure 262 and the second dielectric structure 264 are composed of different dielectric materials, such as silicon oxide and silicon nitride respectively. However, the preset invention is not so limited. FIGS. 5A to 5D are schematic views showing the fourth embodiment of the present invention with the first dielectric structure 262 and the second dielectric structure 264 being fabricated of using identical dielectric material. As shown in FIG. 5A, after the contact window 370 is formed in the P-body 320, a second dielectric layer 363 is deposited to cover the whole exposed surfaces. The second dielectric layer 363 is fabricated by using the material identical to the first dielectric structure 362. Thereafter, as shown in FIG. 5B, an anisotropic etching process is carried out by using the dielectric structure 364 on the sidewall of the contact window 370 as a mask so that a narrow trench 372 is formed below the contact window 370 penetrating the heavily doped region 380 and extending to the N-type epitaxial layer 310.

Figure 5C:
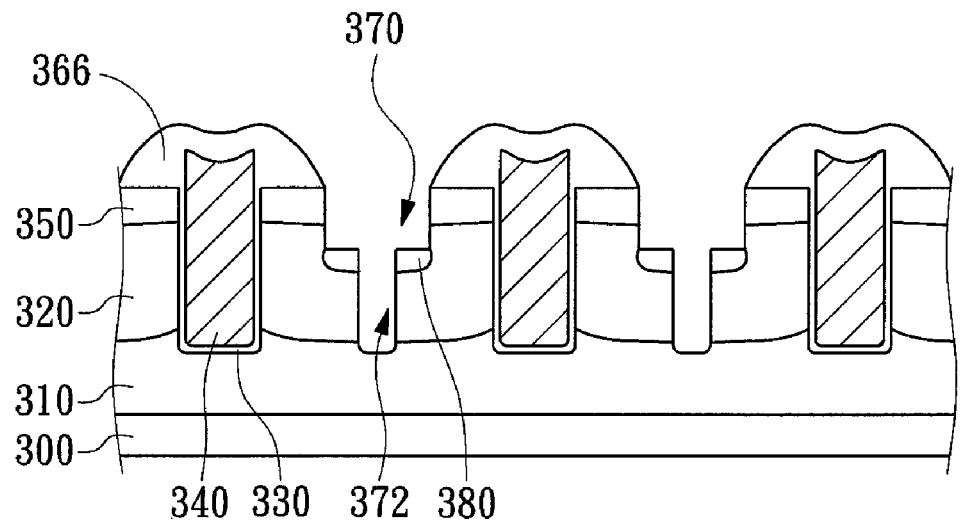
Figure 5D:
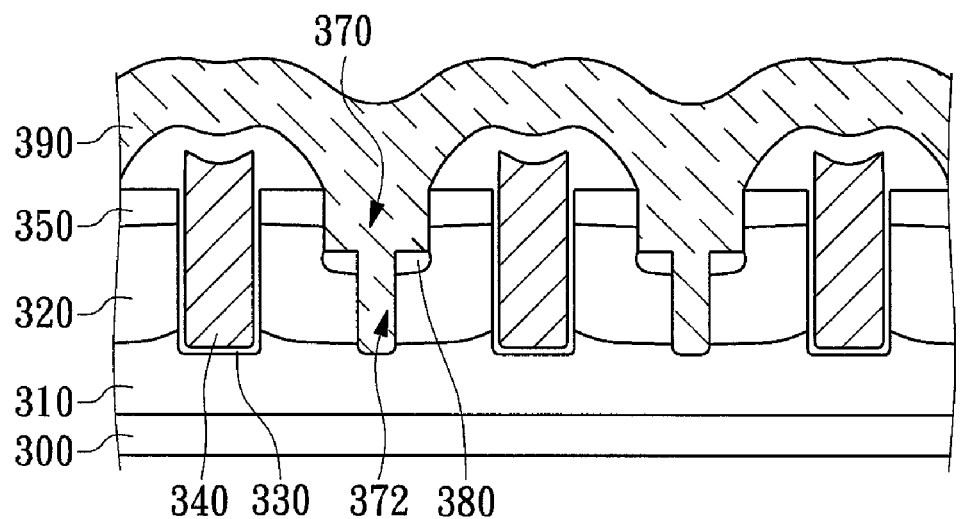

Then, as shown in FIG. 5C, the dielectric structure 364 on the sidewall of the contact window 370 is removed to expose the source region 350 adjacent to the contact window 370. Since the width of the contact window 370 is much greater than the width of the gate structure 340 and the second dielectric layer 363 has enough thickness to fill the concave above the gate structure 340. Thus, after the etching steps of FIGS. 5B and 5C, a portion of the dielectric structure 366 is still remained on the upper surface of the gate structure 340. Finally, as shown in FIG. 5D, a metal layer 390 is filled into the contact window 370 and the narrow trench 372, and the fabrication process of the trenched power semiconductor structure with a schottky diode is finished.

As mentioned above, the fabrication method of the trenched power semiconductor structure with schottky diodes in accordance with the embodiments of the present invention can be proceeded by using typical trenched power MOSFET fabrication technologies and is especially suitable for small line-width process. Since the related equipments and processes are well-established and widely used for fabricating trenched power transistors, the fabrication method provided in the present invention has the advantage of low cost and high applicability. In addition, the power semiconductor structure provided in the present invention does not need to use additional lithographic step to define the location of the schottky diode, which is also helpful for reducing fabrication cost.

While the preferred embodiments of the present invention have been set forth for the purpose of disclosure, modifications of the disclosed embodiments of the present invention as well as other embodiments thereof may occur to those skilled in the art. Accordingly, the appended claims are intended to cover all embodiments which do not depart from the spirit and scope of the present invention.

What is claimed is:

1. A fabrication method of a trenched power semiconductor structure with a schottky diode comprising the steps of:
    a) providing a drain region;
    b) forming at least two gate structures above the drain region, and forming a body and at least a source region between the two neighboring gate structures;
    c) forming a first dielectric structure covering the gate structure;
    d) by using the first dielectric structure as an etching mask, forming a contact window with a sidewall adjacent to the source region;
    e) forming a second dielectric structure in the contact window, and the second dielectric structure defining at least an opening to expose a portion of a bottom of the contact window;
    f) etching the body through the second dielectric structure to form a narrow trench extending to the drain region below the body, and a width of the narrow trench being smaller than that of the contact window; and
    g) filling the contact window and the narrow trench with a metal layer to form the schottky diode at an interface between the metal layer and the drain region.

2. The fabrication method of a trenched power semiconductor structure with a schottky diode of claim 1, wherein the step of forming the first dielectric structure comprises:
    depositing a first dielectric layer; and
    forming at least an opening, which is utilized to define the contact window, in the first dielectric layer.

3. The fabrication method of a trenched power semiconductor structure with a schottky diode of claim 1, after the step of forming the contact window, further comprising the step of forming a heavily doped region in the body below the contact window.

4. The fabrication method of a trenched power semiconductor structure with a schottky diode of claim 1, wherein the second dielectric structure comprises a sidewall structure extended from the bottom of the contact window upward to the first dielectric structure.

5. The fabrication method of a trenched power semiconductor structure with a schottky diode of claim 1, wherein the step of forming the second dielectric structure comprises:
    depositing a second dielectric layer on the first dielectric structure and the contact window; and
    removing a portion of the second dielectric layer on an upper surface of the first dielectric structure and a portion of the second dielectric layer on the bottom of the contact window to form the second dielectric structure covering at least the sidewall of the contact window.

6. The fabrication method of a trenched power semiconductor structure with a schottky diode of claim 1, wherein the step of forming the gate structure and the first dielectric structure comprising:
    forming a pattern layer on a substrate with the drain region therein;
    etching the substrate through the pattern layer to form a plurality of trenches;
    forming a gate dielectric layer on an inner surface of the trenches;
    forming the gate structures by filling polysilicon material in the trenches and opens of the pattern layer;
    removing the pattern layer; and
    forming the first dielectric structure lining at least an exposed sidewall of the gate structure protruded from the substrate.

7. The fabrication method of a trenched power semiconductor structure with a schottky diode of claim 6, wherein after the step of forming the first dielectric structure, an upper surface of the gate structure is exposed.

8. The fabrication method of a trenched power semiconductor structure with a schottky diode of claim 7, wherein the gate structure is etched through the upper surface thereof to form a concave encircled by the first dielectric structure in the step of forming the contact window.

9. The fabrication method of a trenched power semiconductor structure with a schottky diode of claim 8, wherein the step of forming the second dielectric structure comprises:
    depositing a second dielectric layer on the first dielectric structure and the contact window, the second dielectric layer substantially filling the concave above the gate structure; and
    removing a portion of the second dielectric layer on the bottom of the contact window by etching to form the second dielectric structure at least covering the sidewall of the contact window and the upper surface of the gate structure.

10. The fabrication method of a trenched power semiconductor structure with a schottky diode of claim 9, after the step of forming the narrow trench further comprising the step of removing a portion of the second dielectric structure covering the sidewall of the contact window to expose the source region, and leaving a portion of the second dielectric structure covering the gate structure.

11. The fabrication method of a trenched power semiconductor structure with a schottky diode of claim 9, wherein a depth of the concave above the gate structure is much greater than a thickness of the second dielectric layer.

12. The fabrication method of a trenched power semiconductor structure with a schottky diode of claim 6, wherein the step of forming the first dielectric structure comprises:
    depositing a first dielectric layer to cover the gate structure;
    etching the first dielectric layer to from the first dielectric structure lining at least the exposed sidewall of the gate structure protruded from the substrate.

13. The fabrication method of a trenched power semiconductor structure with a schottky diode of claim 1, wherein a width of the contact window is greater than that of the gate structure.

14. A trenched power semiconductor structure with a schottky diode comprising:
    a drain region;
    at least two gate structures, located above the drain region;
    a body, located above the drain region and between the neighboring gate structures;
    at least a source region, located in the body and adjacent to the gate structure;
    a dielectric structure, located on the body and covering the gate structures;
    a contact window, extended from an upper portion of the body upward to the dielectric structure and adjacent to the source region;
    a narrow trench, extended from a bottom of the contact window to the drain region, and having a width smaller than that of the contact window; and a metal layer, filled into the contact window and the narrow trench to electrically connect the source region and the drain region.

15. The trenched power semiconductor structure with a schottky diode of claim 14, further comprising a heavily doped region, located in the body below the contact window, and the narrow trench penetrating the heavily doped region.

16. The trenched power semiconductor structure with a schottky diode of claim 14, wherein the gate structure is protruded from an upper surface of the body.

17. The trenched power semiconductor structure with a schottky diode of claim 16, wherein the dielectric structure has a first portion and a second portion, the first portion is extended from the upper surface of the body upward to cover a sidewall of the gate structure, and the second portion covers an upper surface of the gate structure.

18. The trenched power semiconductor structure with a schottky diode of claim 14, wherein a width of the contact window is greater than that of the gate structure.

* * * * *